(12) United States Patent
Yi

(10) Patent No.: US 11,004,911 B2
(45) Date of Patent: May 11, 2021

(54) ACTIVE-MATRIX ORGANIC LIGHT EMITTING DIODE DISPLAY PANEL STRUCTURE

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 51 days.

(21) Appl. No.: 16/340,119

(22) PCT Filed: Jan. 8, 2019

(86) PCT No.: PCT/CN2019/070861
§ 371 (c)(1),
(2) Date: Apr. 7, 2019

(87) PCT Pub. No.: WO2020/098136
PCT Pub. Date: May 22, 2020

(65) Prior Publication Data
US 2020/0219944 A1      Jul. 9, 2020

(30) Foreign Application Priority Data
Nov. 15, 2018   (CN) .......................... 201811361314.9

(51) Int. Cl.
*H01L 27/32*      (2006.01)

(52) U.S. Cl.
CPC ...... *H01L 27/3223* (2013.01); *H01L 27/3211* (2013.01); *H01L 27/3244* (2013.01)

(58) Field of Classification Search
CPC ............. H01L 27/3244; H01L 27/3211; H01L 27/3223
See application file for complete search history.

(56) References Cited

U.S. PATENT DOCUMENTS 10,522,587 B2 * 12/2019 Zeng .................. H01L 27/1214
2016/0120005 A1    4/2016 Wu et al.
(Continued)

FOREIGN PATENT DOCUMENTS

| CN | 107255884 A | 10/2017 |
| CN | 107942564 A | 4/2018 |
| CN | 108565281 A | 9/2018 |

*Primary Examiner* — Mohammed Shamsuzzaman
(74) *Attorney, Agent, or Firm* — Mark M. Friedman

(57) ABSTRACT

An active-matrix organic light emitting diode display panel structure includes: a displaying region including at least one curved peripheral portion located on an outer edge; displaying pixel units disposed in the displaying region, some of the units are defined as at least one group disposed adjacent to each of the at least one curved peripheral portion; at least one group of dummy pixel units disposed on the outer edge of the displaying region and corresponding to the at least one curved peripheral portion, the dummy pixel units connected to a group of peripheral displaying pixel units that is connected to the each curved peripheral portion, and located outside the group of the peripheral displaying pixel units. Each of the peripheral displaying pixel units is directly connected to the dummy pixel units. The dummy pixel units can lower loading effect of the peripheral displaying pixel units and prevent a brightness decreasing issue.

10 Claims, 10 Drawing Sheets

(56) References Cited

U.S. PATENT DOCUMENTS

| | | | |
|---|---|---|---|
| 2018/0026080 A1* | 1/2018 | Lee | H01L 27/3211 257/40 |
| 2018/0075797 A1* | 3/2018 | Park | G09G 3/2092 |
| 2018/0107084 A1* | 4/2018 | Hirata | G02F 1/1345 |
| 2019/0305221 A1* | 10/2019 | Hou | H01L 51/56 |

* cited by examiner

ACTIVE-MATRIX ORGANIC LIGHT EMITTING DIODE DISPLAY PANEL STRUCTURE

FIELD OF INVENTION

The present invention relates to an active-matrix organic light emitting diode (AMOLED) display panel structure that increases dummy pixel units on a curved periphery of a displaying region of the AMOLED display panel to decrease a loading effect to displaying pixel units of the curved periphery of the displaying region, which improves uniformity of the AMOLED display panel and enhances displaying effect.

BACKGROUND OF INVENTION

An active-matrix organic light emitting diode (AMOLED) display panel has of self-luminance characteristics and employs an ultra-thin organic material coating layer and a glass substrate. The organic material is self-luminous when electrified. The AMOLED display panel is self-luminous and needs no backlight modules as required by a thin film transistor liquid crystal display (TFT LCD). Furthermore, the AMOLED display panel has advantages of wide viewing angles and high saturation. Especially, the AMOLED display panel has advantages of a low drive voltage, low power consumption, fast response times, light weight, a thin thickness, a simple structure, and a low cost. Therefore, the AMOLED display panel is regarded as one of the most promising panel products nowadays.

With reference to FIGS. 1 and 2, a conventional AMOLED display panel has a bezel 90 and a displaying region 91. The displaying region 91 disposed in the bezel is substantially rectangular in shape and has four corners and four curved edges 910 located on the four corners respectively. Furthermore, the displaying region 91 is disposed with a plurality of pixel units 915 that are arranged in an array, the pixel units 915 are red, green, and blue pixel units 915 arranged according to specific rules.

However, brightness of the pixel units 915 located on the curved edges 910 of the displaying region 91 is easily lowered or uneven due to loading effect, which seriously influences displaying effect.

The above loading effect refers that during exposure, development and etching processes of an array substrate of the AMOLED display panel, because pattern density of edge pixel units 915 in regions of the curved edges 910 are different from pattern density of internal pixel units 915 to cause that an actual dimension of the edge pixel units 915 is different from a predetermined dimension, which results in unevenness of displaying brightness or color of the edge pixel units 915.

Therefore, it is necessary to provide an active-matrix organic light emitting diode (AMOLED) display panel structure to solve the technical issue of the prior art.

SUMMARY OF INVENTION

Technical Issue

An objective of the present invention is to provide an active-matrix organic light emitting diode (AMOLED) display panel structure that increases dummy pixel units on a curved periphery of a displaying region of the AMOLED display panel to eliminate effect of loading effect to displaying pixel units of the curved periphery of the displaying region and to increase uniformity of the AMOLED display panel and enhance displaying effect.

Technical Solution

To achieve the above objective of the present invention, an embodiment of the present invention provides an active-matrix organic light emitting diode (AMOLED) display panel structure, comprising a displaying region and a non-displaying region surrounding the displaying region, wherein:

the displaying region comprises an outer edge, and the outer edge comprises at least one curved peripheral portion;

a plurality of displaying pixel units are disposed in the displaying region, and the displaying pixel units located in the at least one curved peripheral portion comprise at least one group of peripheral displaying pixel units;

a plurality of dummy pixel units are disposed in the non-displaying region, and the dummy pixel units located in the at least one curved peripheral portion comprise at least one group of dummy pixel units, the at least one group of dummy pixel units corresponds to and is connected to the at least one group of peripheral displaying pixel units located in each of the at least one curved peripheral portion; and the at least one group of peripheral displaying pixel units is connected to at least one of the dummy pixel units.

In the present invention, each of the displaying pixel units comprises sub-pixels, each of the sub-pixels is a blue sub-pixel, a red sub-pixel or a green sub-pixel and is configured to emit red, green or blue light.

In the present invention, the at least one curved peripheral portion is convex.

In the present invention, the at least one curved peripheral portion is concave.

In the present invention, the at least one curved peripheral portion is a circular slot with an opening.

In the present invention, the outer edge of the displaying region further comprises two inclined peripheral portions; two ends of the at least one curved peripheral portion are connected to the two inclined peripheral portions respectively; the at least one group of peripheral displaying pixel units comprises two groups of the peripheral displaying pixel units, the at least one group of dummy pixel units comprises two groups of the dummy pixel units, the two groups of the peripheral displaying pixel units are disposed adjacent to the two inclined peripheral portions respectively, and each of the two groups of the peripheral displaying pixel units is connected to one of the two groups of the dummy pixel units, the two groups of dummy pixel units are located outside the two groups of the peripheral displaying pixel units, wherein each of the inclined peripheral portions is located between each of the two groups of the peripheral displaying pixel units and each of the two groups of the dummy pixel units that is connected to the group of the peripheral displaying pixel units.

In the present invention, each of the at least one curved peripheral portion has a complex curve-shape, and the complex curve-shaped is formed by a convex line and a concave line connected to each other.

In the present invention, a curved extension range protruding outwardly from each of the at least one curved peripheral portion, and one of the groups of the dummy pixel units corresponds to each of the at least one curved peripheral portion is located substantially in the curved extension range.

In the present invention, each of some of the dummy pixel units is directly connected to one of the peripheral displaying pixel units.

In the present invention, each of some of the dummy pixel units is indirectly connected to one of the peripheral displaying pixel units through at least another dummy pixel unit.

Another embodiment of the present invention provides an AMOLED display panel structure, comprising a displaying region and a non-displaying region surrounding the displaying region, wherein:

- the displaying region comprises an outer edge, and the outer edge comprises at least one curved peripheral portion;
- a plurality of displaying pixel units are disposed in the displaying region, and the displaying pixel units located in the at least one curved peripheral portion comprise at least one group of peripheral displaying pixel units;
- a plurality of dummy pixel units are disposed in the non-displaying region, and the dummy pixel units located in the at least one curved peripheral portion comprise at least one group of dummy pixel units, the at least one group of dummy pixel units corresponds to and is connected to the at least one group of peripheral displaying pixel units located in each of the at least one curved peripheral portion;
- the at least one group of peripheral displaying pixel units is connected to at least one of the dummy pixel units;
- each of the displaying pixel units comprises sub-pixels, each of the sub-pixels is a blue sub-pixel, a red sub-pixel or a green sub-pixel and is configured to emit red, green or blue light; and
- the at least one curved peripheral portion is convex or concave.

In the present invention, the at least one curved peripheral portion is a circular slot with an opening.

In the present invention, the at least one curved peripheral portion is a circular slot with an opening.

In the present invention, the outer edge of the displaying region further comprises two inclined peripheral portions; two ends of the at least one curved peripheral portion are connected to the two inclined peripheral portions respectively; the at least one group of peripheral displaying pixel units comprises two groups of the peripheral displaying pixel units, the at least one group of dummy pixel units comprises two groups of the dummy pixel units, the two groups of the peripheral displaying pixel units are disposed adjacent to the two inclined peripheral portions respectively, and each of the two groups of the peripheral displaying pixel units is connected to one of the two groups of the dummy pixel units, the two groups of dummy pixel units are located outside the two groups of the peripheral displaying pixel units, wherein each of the inclined peripheral portions is located between each of the two groups of the peripheral displaying pixel units and each of the two groups of the dummy pixel units that is connected to the group of the peripheral displaying pixel units.

In the present invention, each of the at least one curved peripheral portion has a complex curve-shape, and the complex curve-shaped is formed by a convex line and a concave line connected to each other.

In the present invention, a curved extension range protruding outwardly from each of the at least one curved peripheral portion, and one of the groups of the dummy pixel units corresponds to each of the at least one curved peripheral portion is located substantially in the curved extension range.

In the present invention, each of some of the dummy pixel units is directly connected to one of the peripheral displaying pixel units.

In the present invention, each of some of the dummy pixel units is indirectly connected to one of the peripheral displaying pixel units through at least another dummy pixel unit.

Advantages

Compared to the prior art, the AMOLED display panel structure of the present invention disposes on the curved peripheral portion of the outer edge of the displaying region the dummy pixel units extending outwardly from the peripheral displaying pixel units. These dummy pixel units surround the peripheral displaying pixel units and make the peripheral displaying pixel units non-edge pixel units. By increasing the dummy pixel units, the present invention is able to make a wire density of the peripheral displaying pixel units of the displaying region consistent with a wire density of the displaying pixel units in a central region of the displaying region such that an actual dimension of the peripheral displaying pixel units of the displaying region displaying region is the same as that in the central region to prevent uneven displaying effect issue due to the loading effect during the processes.

In order to make the above contents of the present invention more clear and understandable, the following preferred embodiment will be described in detail with reference to the drawings.

DETAILED DESCRIPTION OF PREFERRED EMBODIMENTS

Figure 1:
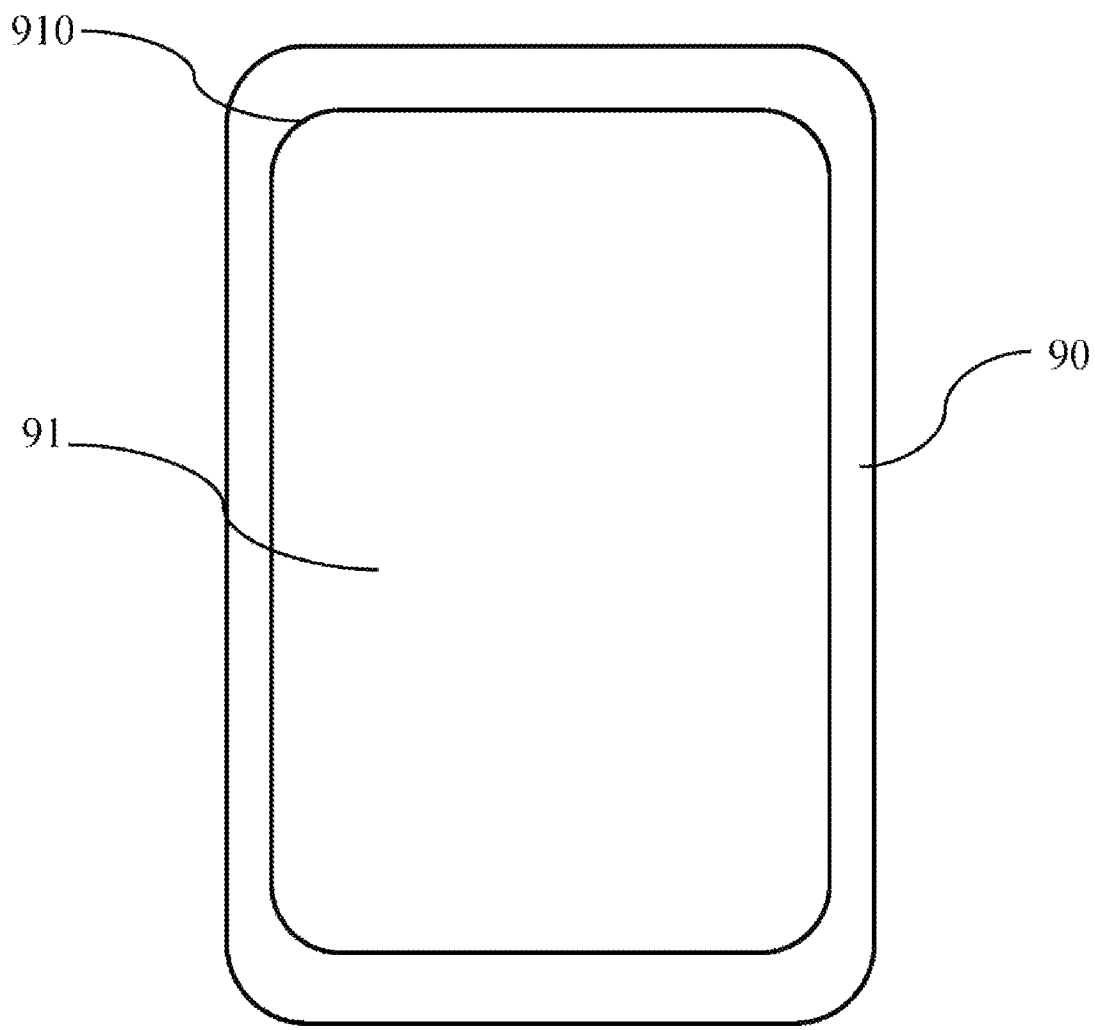
FIG. 1 is a top view of a conventional active-matrix organic light emitting diode (AMOLED) display panel structure.
Figure 2:
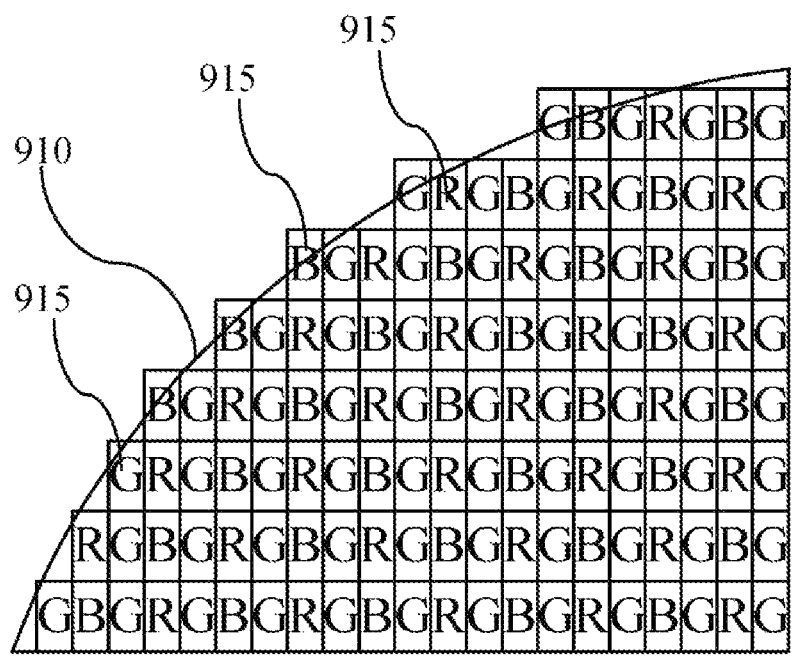
FIG. 2 is a partially enlarged top view of another conventional AMOLED display panel structure.
Figure 3:
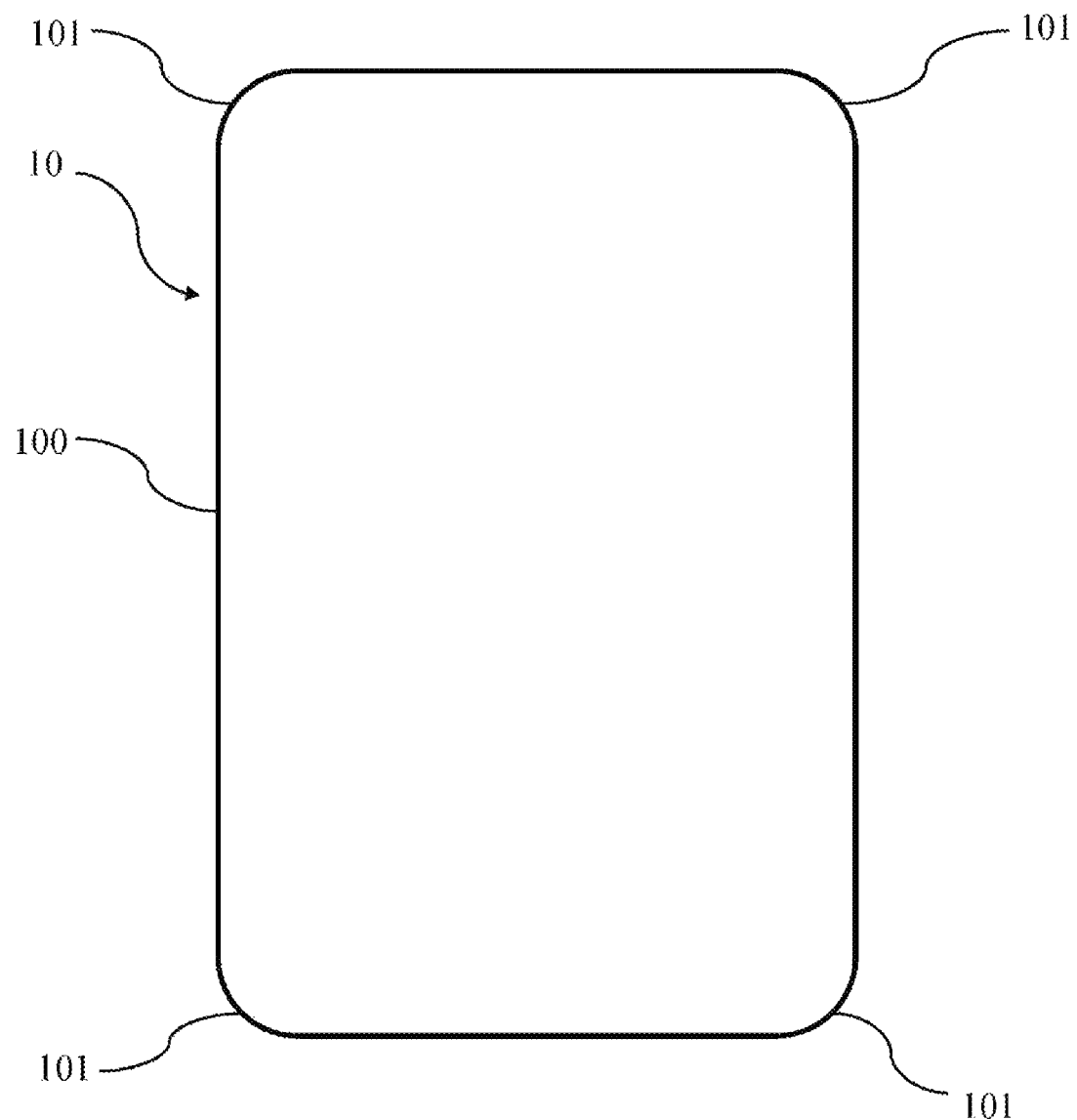
FIG. 3 is a top view of an active-matrix organic light emitting diode (AMOLED) display panel structure of a first embodiment of the present invention.
Figure 4:
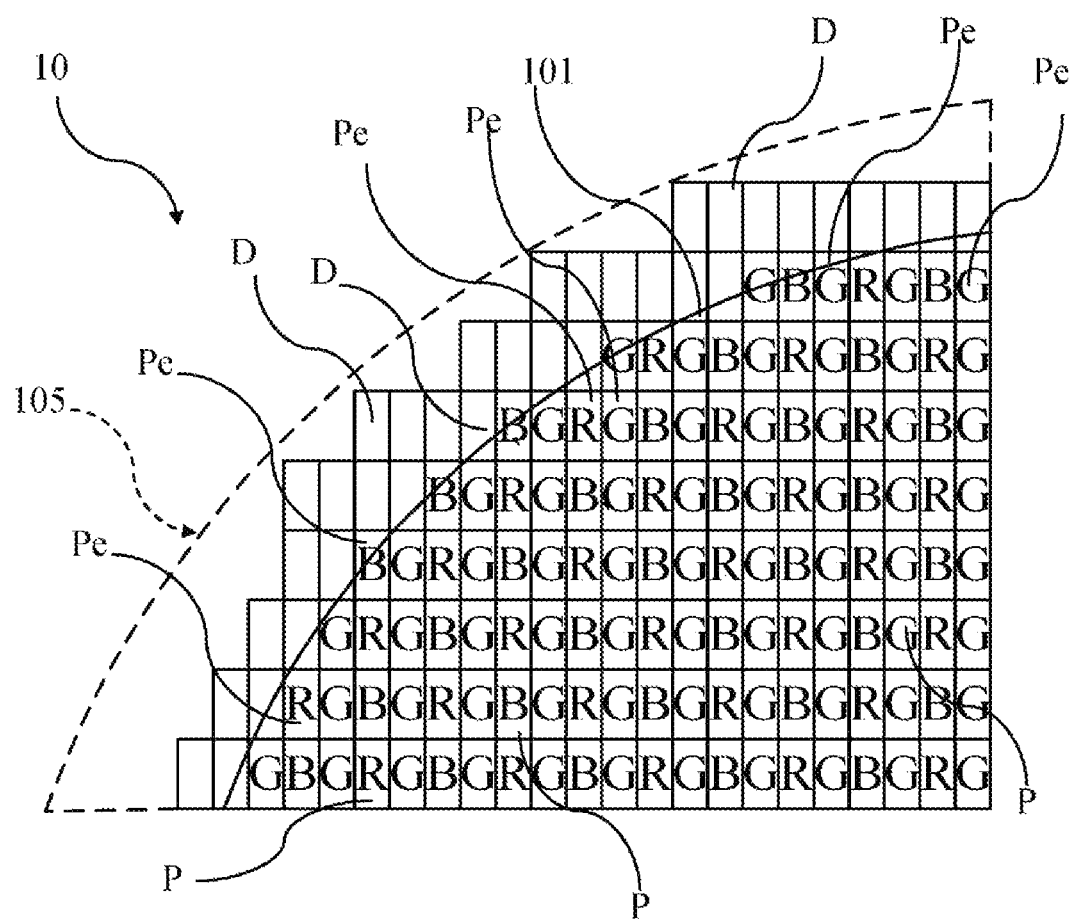
FIG. 4 is a partially enlarged top view of the first embodiment of the AMOLED display panel structure of the present invention.

With reference to FIGS. 3 and 4, a first embodiment of an active-matrix organic light emitting diode (AMOLED) display panel structure of the present invention comprises: a displaying region 10, a non-displaying region surrounding the displaying region 10, a plurality of displaying pixel units P, and at least one group of dummy pixel units D.

The displaying region 10 comprises an outer edge 100, the outer edge 100 surrounds the displaying region 10. The outer edge 100 comprises at least one curved peripheral portion 101. Furthermore, each of the at least one curved peripheral portion 101 is convex.

The displaying pixel units P are disposed in the displaying region 10. The displaying pixel units P in each of the at least one curved peripheral portion 101 comprise at least one group of peripheral displaying pixel units Pe. The at least one group of peripheral displaying pixel units Pe are disposed adjacent to the at least one curved peripheral portion 101. The peripheral displaying pixel units Pe comprises sub-pixels, and the sub-pixels are blue sub-pixels, red sub-pixels or green sub-pixels.

The at least one group of dummy pixel units D is disposed in the non-displaying region. The dummy pixel units D located on each of the at least one curved peripheral portion 101 comprise at least one group of dummy pixel units, the at least one group of dummy pixel units D is connected to the at least one group of peripheral displaying pixel units Pe located in each of the at least one curved peripheral portion 101. Each of the dummy pixel units D has no sub-pixels.

Each of the peripheral displaying pixel units Pe is directly connected to at least one of the dummy pixel units D.

With reference to FIG. 4, in the present invention, each of some of the dummy pixel units D is directly connected to one of the peripheral displaying pixel units Pe, each of some others of the dummy pixel units D is indirectly connected to one of the peripheral displaying pixel units Pe through at least one another dummy pixel unit D.

In the present invention, a curved extension range 105 extends outwardly from each of the at least one curved peripheral portion 101. One of the groups of the dummy pixel units D corresponding to each of the at least one curved peripheral portion 101 is substantially located in the curved extension range 105. The curved extension range 105 is a virtual range that is defined for explanation of the present invention, instead of being physical elements of the display panel structure.

Figure 5:
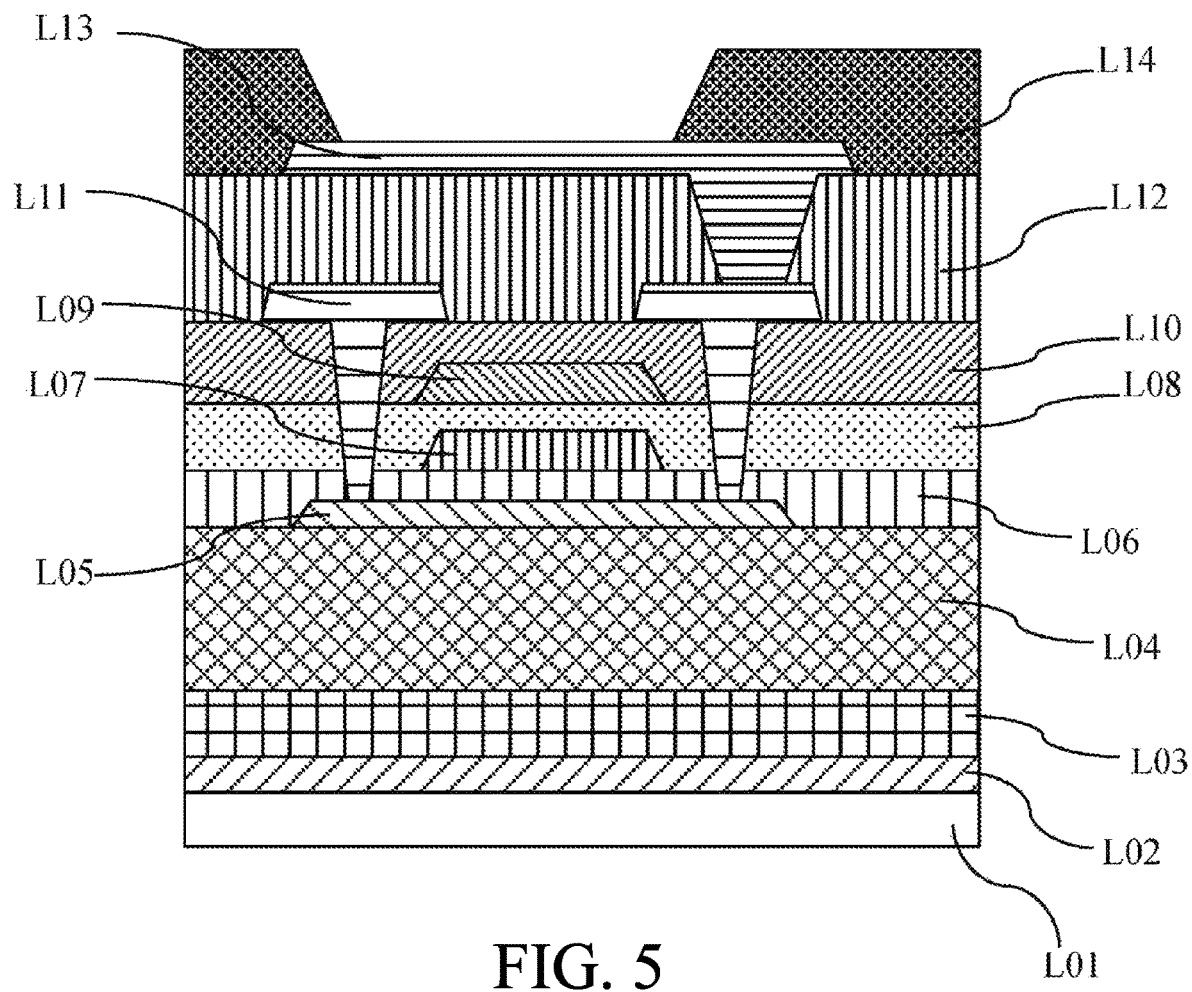
FIG. 5 is a cross-sectional view of displaying pixel units of the first embodiment of the AMOLED display panel structure of the present invention.

With reference to FIG. 5, each of the displaying pixel units P comprises a first polyimide layer L01, a first buffer layer L02, a second polyimide layer L03, a second buffer layer L04, a low temperature polysilicon layer L05, a first gate electrode insulation layer L06, a first gate electrode layer L07, a second gate electrode insulation layer L08, a second gate electrode layer L09, an interlayer dielectric layer L10, a source/drain electrode layer L11, a planarization layer L12, an anode layer L13, and a pixel definition and photoresist layer L14 that are sequentially stacked one another from bottom to top.

Figure 6:
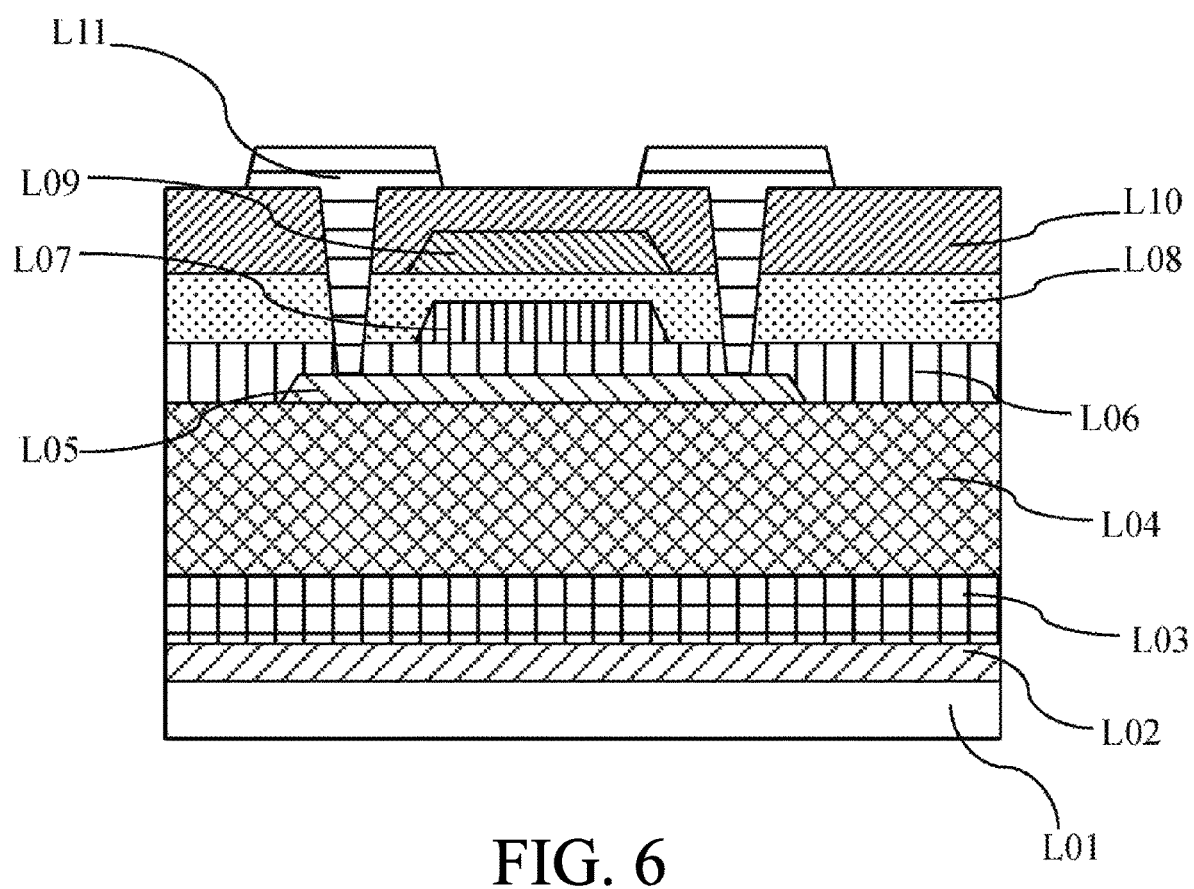
FIG. 6 is a cross-sectional view of dummy pixel units of the first embodiment of the AMOLED display panel structure of the present invention.

With reference to FIG. 6, each of the dummy pixel units D comprises a first polyimide layer L01, a first buffer layer L02, a second polyimide layer L03, a second buffer layer L04, a low temperature polysilicon layer L05, a first gate electrode insulation layer L06, a first gate electrode layer L07, a second gate electrode insulation layer L08, a second gate electrode layer L09, an interlayer dielectric layer L10, a source/drain electrode layer L11, and a planarization layer L12 that are sequentially stacked one another from bottom to top. In other words, each of the dummy pixel units D, compared to each of the displaying pixel units P, omits an anode layer L13 and a pixel definition and photoresist layer L14.

Figure 7:
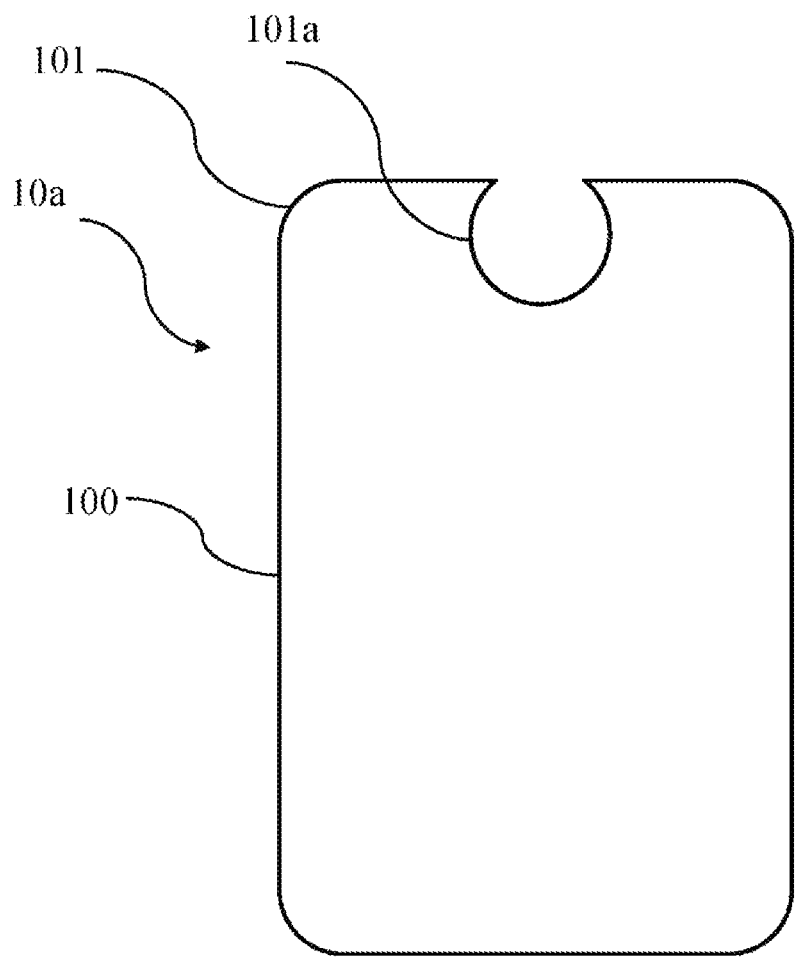
FIG. 7 is a top view of an AMOLED display panel structure of a second embodiment of the present invention.
Figure 8:
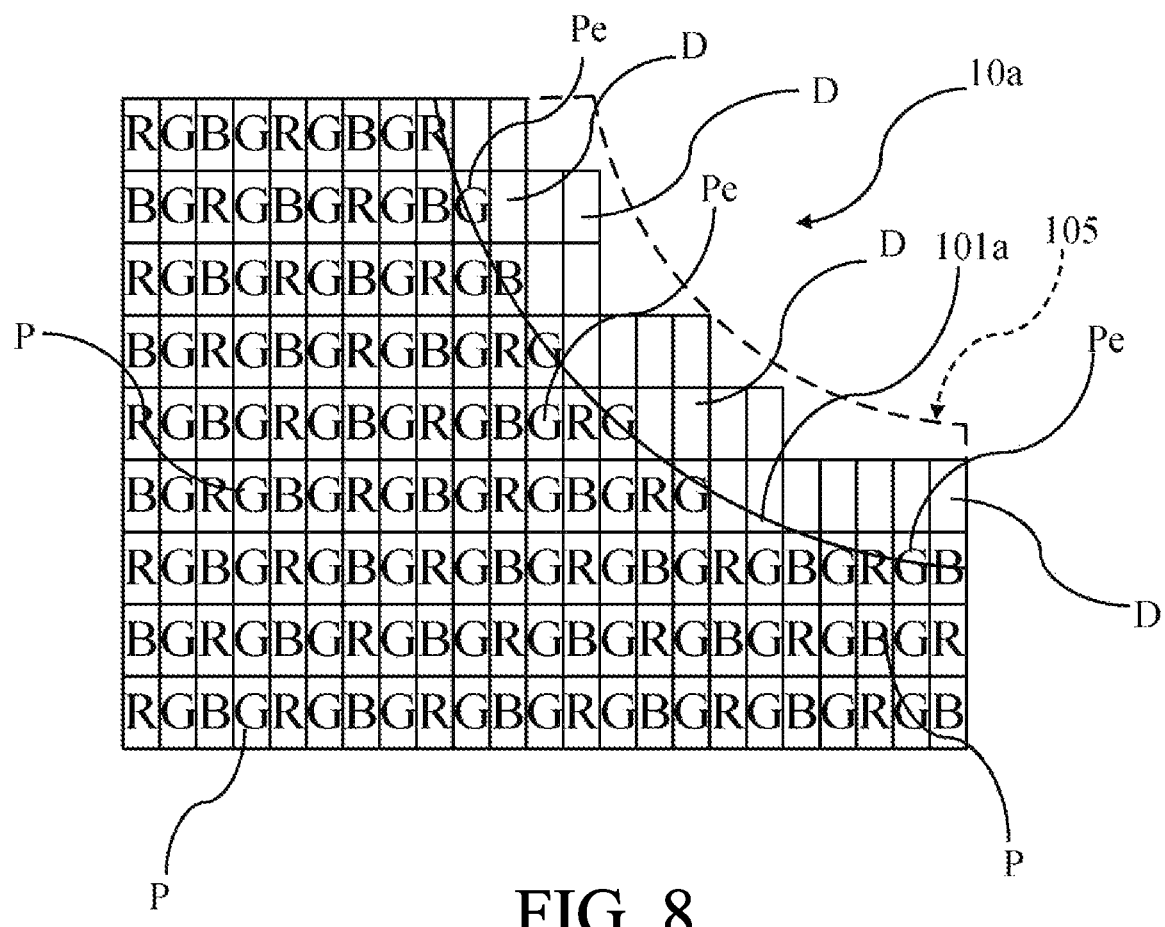
FIG. 8 is a partially enlarged top view of the AMOLED display panel structure of the second embodiment of the present invention.

With reference to FIGS. 7 and 8, a second embodiment of the AMOLED display panel structure of the present invention is similar to the first embodiment, and a difference of the second embodiment is as follows. The outer edge 100 of the displaying region 10a further comprises a curved peripheral portion 101a, each of the at least one curved peripheral portion 101a is concave. Specifically, each of the at least one curved peripheral portion 101a is a circular slot with an opening, or is inverted Ω-shaped.

Figure 9:
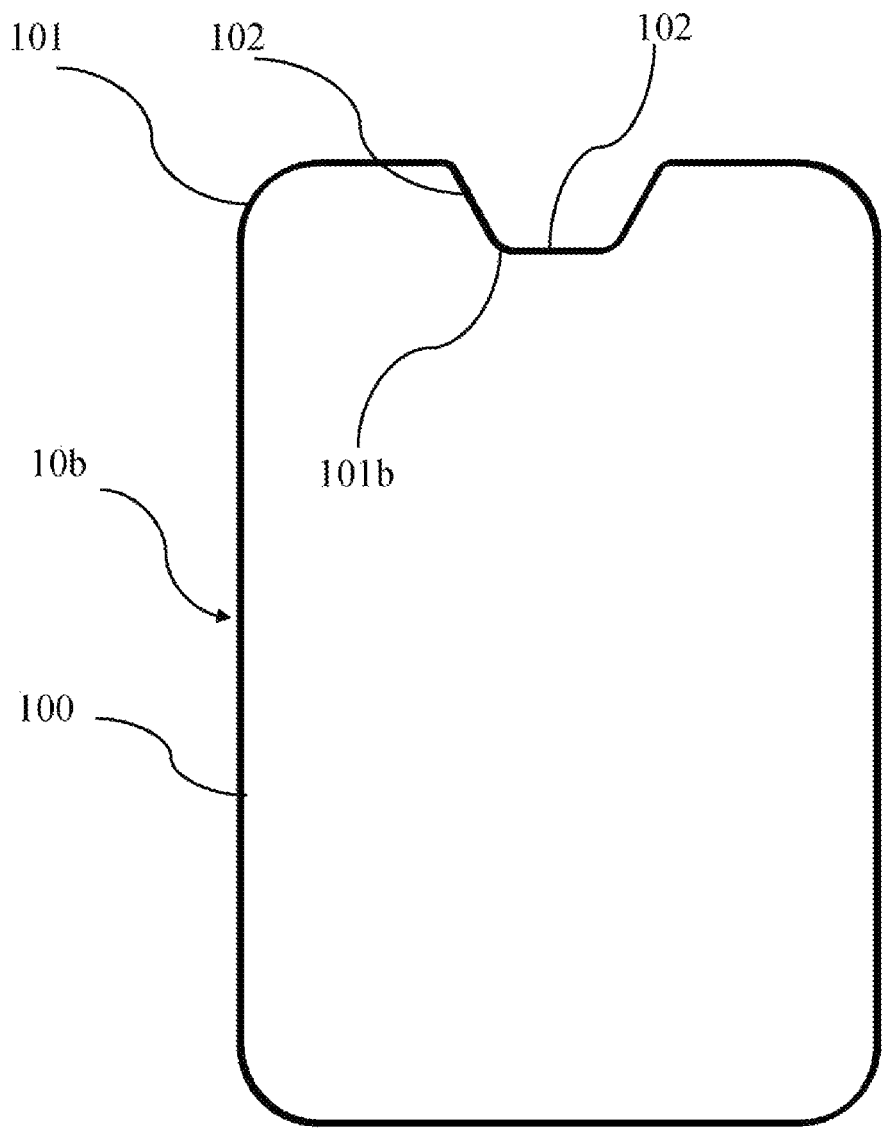
FIG. 9 is a top view of an AMOLED display panel structure of a third embodiment of the present invention.

With reference to FIG. 9, a third embodiment of the AMOLED display panel structure of the present invention is similar to the first embodiment, and a difference of the third embodiment is as follows. The outer edge 100 of a displaying region 10b further comprises a curved peripheral portion 101b, two ends of the at least one curved peripheral portion 101b are connected to two inclined peripheral portions 102 respectively, and the two inclined peripheral portions 102 are formed on the outer edge 100. The at least one group of peripheral displaying pixel units Pe further comprises two groups of peripheral displaying pixel units Pe, the at least one group of dummy pixel units D further comprises two groups of dummy pixel units D, the two groups of the peripheral displaying pixel units Pe are disposed adjacent to the two inclined peripheral portions 102 respectively, and the at least one group of peripheral displaying pixel units Pe is connected to one of the groups of the dummy pixel units D. The two groups of dummy pixel units D are located outside the two groups of the peripheral displaying pixel units Pe.

In another embodiment of the present invention, each of the at least one curved peripheral portion can comprise a complex curve-shape, and the complex curve-shape is formed by a convex line as shown on the curved peripheral portion 101 in FIG. 4 connecting to a concave line as shown on the curved peripheral portion 101 in FIG. 8.

Figure 10:
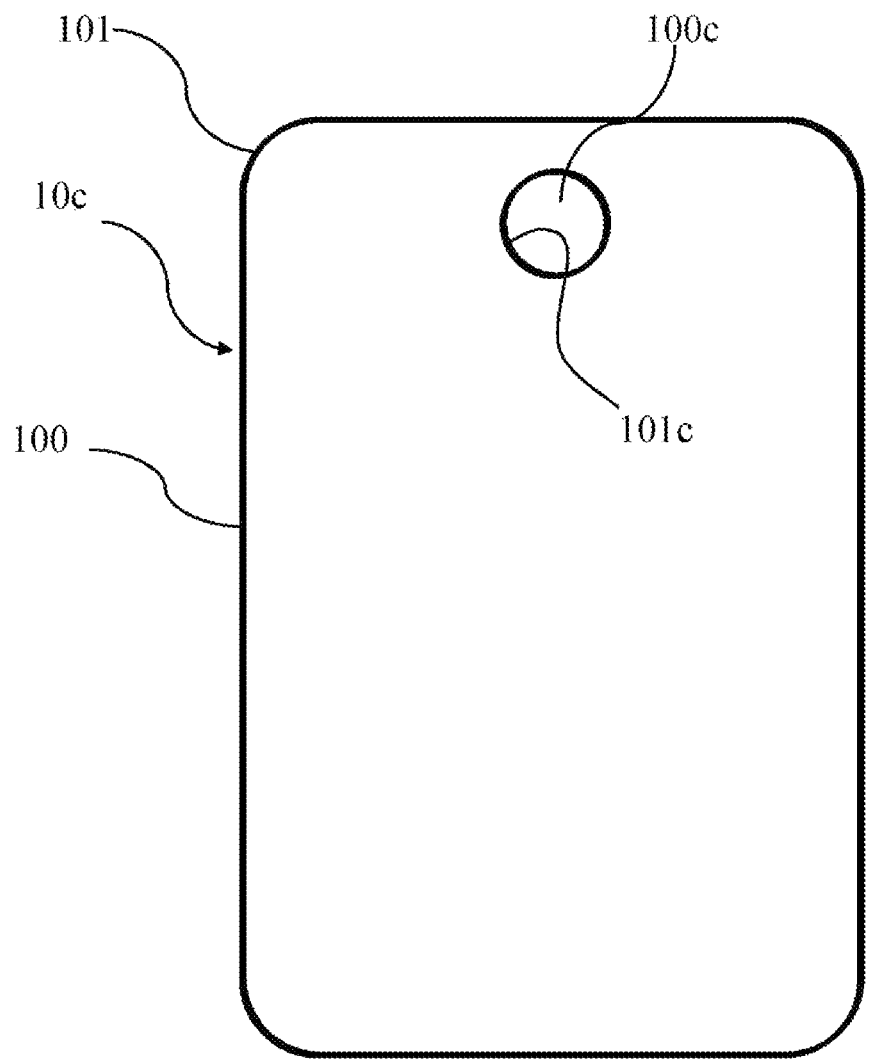
FIG. 10 is a top view of an AMOLED display panel structure of a fourth embodiment of the present invention.

With reference to FIG. 10, a fourth embodiment of the AMOLED display panel structure of the present invention is similar to the first embodiment, and a difference of the fourth embodiment is as follows.

A displaying region 10c comprises a closed hole 100c, a closed circular portion 101c is formed on an inner edge of the closed hole 100c.

Some of the displaying pixel units P in the displaying region 10c is defined as a group of peripheral displaying pixel units Pe, the group of the peripheral displaying pixel units Pe is disposed adjacent to the closed circular portion 101c.

One of the groups of the dummy pixel units D is disposed on the inner edge of the closed hole 100c in the displaying region 10c, and corresponds to the closed circular portion 101c. The group of the dummy pixel units D is connected to the group of the peripheral displaying pixel units Pe, and is located outside the group of the peripheral displaying pixel units Pe. Each of the peripheral displaying pixel units Pe is directly connected to at least one of the dummy pixel units D.

Compared to the prior art, the AMOLED display panel structure of the present invention disposes on the curved peripheral portion 101 of the outer edge 100 of the displaying region 10 or on the inner edge of the closed hole 100c, the dummy pixel units D extending outwardly from the peripheral displaying pixel units Pe. These dummy pixel units D surround the peripheral displaying pixel units Pe and make the peripheral displaying pixel units Pe non-edge pixel units. By increasing the dummy pixel units, the present invention is able to make wire density of the peripheral displaying pixel units Pe of the displaying region consistent with a wire density of the displaying pixel units in a central region of the displaying region 10 such that an actual dimension of the peripheral displaying pixel units Pe of the displaying region displaying region 10 is the same as that in the central region to prevent an uneven displaying effect issue due to the loading effect during the processes.

What is claimed is:

1. An active-matrix organic light emitting diode (AMOLED) display panel structure, comprising a displaying region and a non-displaying region surrounding the displaying region, wherein:
    the displaying region comprises an outer edge, and the outer edge comprises a curved peripheral portion;
    a plurality of displaying pixel units are disposed in the displaying region, and the displaying pixel units located in the curved peripheral portion comprise at least one group of peripheral displaying pixel units;
    a plurality of dummy pixel units are disposed in the non-displaying region, the dummy pixel units located in the curved peripheral portion comprise at least one group of dummy pixel units, the at least one group of dummy pixel units corresponds to and is connected to the at least one group of peripheral displaying pixel units located in the curved peripheral portion; and
    the at least one group of peripheral displaying pixel units is connected to at least one of the dummy pixel units, the peripheral displaying pixel units comprise sub-pixels, and each dummy pixel unit has no sub-pixels;
    wherein the curved peripheral portion is concave;
    wherein two ends of the curved peripheral portion are connected to two inclined peripheral portions respectively and the two inclined portions are formed on the outer edge.

2. The AMOLED display panel structure as claimed in claim 1, wherein each of the displaying pixel units comprises sub-pixels, each of the sub-pixels is a blue sub-pixel, a red sub-pixel, or a green sub-pixel and is configured to emit red, green, or blue light.

3. The AMOLED display panel structure as claimed in claim 1, wherein the curved peripheral portion is convex.

4. The AMOLED display panel structure as claimed in claim 1, wherein a curved extension range protrudes outwardly from the curved peripheral portion, and one of the groups of the dummy pixel units corresponding to the curved peripheral portion is located in the curved extension range.

5. The AMOLED display panel structure as claimed in claim 1, wherein each of some of the dummy pixel units of the plurality of dummy pixel units is directly connected to one of the peripheral displaying pixel units.

6. The AMOLED display panel structure as claimed in claim 1, wherein each of some of the dummy pixel units of the plurality of dummy pixel units is indirectly connected to one of the peripheral displaying pixel units through at least another dummy pixel unit.

7. An active-matrix organic light emitting diode (AMOLED) display panel structure, comprising a displaying region and a non-displaying region surrounding the displaying region, wherein:
    the displaying region comprises an outer edge, and the outer edge comprises a curved peripheral portion;
    a plurality of displaying pixel units are disposed in the displaying region, and the displaying pixel units located in the curved peripheral portion comprise at least one group of peripheral displaying pixel units;
    a plurality of dummy pixel units are disposed in the non-displaying region, the dummy pixel units located in the curved peripheral portion comprise at least one group of dummy pixel units, the at least one group of dummy pixel units corresponds to and is connected to the at least one group of peripheral displaying pixel units located in the curved peripheral portion;
    the at least one group of peripheral displaying pixel units is connected to at least one of the dummy pixel units, the peripheral displaying pixel units comprise sub-pixels, and each dummy pixel unit has no sub-pixels;
    each of the displaying pixel units comprises sub-pixels, each of the sub-pixels is a blue sub-pixel, a red sub-pixel, or a green sub-pixel and is configured to emit red, green, or blue light; and
    the curved peripheral portion is concave;
    wherein two ends of the curved peripheral portion are connected to two inclined peripheral portions respectively and the two inclined portions are formed on the outer edge.

8. The AMOLED display panel structure as chimed in claim 7, wherein a curved extension range protrudes outwardly from the curved peripheral portion, and one of the groups of the dummy pixel units to the curved peripheral portion is located in the curved extension range.

9. The AMOLED display panel structure as chimed in claim 7, wherein each of some of the dummy pixel units of the plurality of dummy pixel units is directly connected to one of the peripheral displaying pixel units.

10. The AMOLED display panel structure as chimed in claim 7, wherein each of some of the dummy pixel units of the plurality of dummy pixel units is indirectly connected to one of the peripheral displaying pixel units through at least another dummy pixel unit.

* * * * *